US 6,555,762 B2

(12) United States Patent
Appelt et al.

(10) Patent No.: US 6,555,762 B2
(45) Date of Patent: *Apr. 29, 2003

(54) ELECTRONIC PACKAGE HAVING SUBSTRATE WITH ELECTRICALLY CONDUCTIVE THROUGH HOLES FILLED WITH POLYMER AND CONDUCTIVE COMPOSITION

(75) Inventors: Bernd K. Appelt, Endicott, NY (US); Jeffrey D. Gelorme, Plainville, CT (US); Sung Kwon Kang, Chappaqua, NY (US); Voya R. Markovich, Endwell, NY (US); Kostas Papathomas, Endicott, NY (US); Sampath Purushothaman, Yorktown Heights, NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/345,428

(22) Filed: Jul. 1, 1999

(65) Prior Publication Data

US 2003/0006066 A1 Jan. 9, 2003

(51) Int. Cl.$^7$ ................................................ H05K 1/11
(52) U.S. Cl. ........................ 174/264; 174/257; 174/258; 174/265
(58) Field of Search ................................ 174/253, 262, 174/264, 265, 261, 257, 258; 361/792, 793, 794, 795

(56) References Cited

U.S. PATENT DOCUMENTS

| 4,383,363 A | | 5/1983 | Hayakawa et al. |
| 4,521,262 A | * | 6/1985 | Pellegrino ................... 156/150 |
| 4,820,376 A | | 4/1989 | Lambert et al. |
| 4,967,314 A | | 10/1990 | Higgins, III |
| 5,038,996 A | | 8/1991 | Wilcox et al. |
| 5,117,069 A | | 5/1992 | Higgins, III |
| 5,220,135 A | | 6/1993 | Kawakami et al. |
| 5,280,414 A | | 1/1994 | Davis et al. |
| 5,432,998 A | | 7/1995 | Galasco et al. |
| 5,450,290 A | | 9/1995 | Boyko et al. |
| 5,473,120 A | * | 12/1995 | Ito et al. .................... 174/264 |
| 5,487,218 A | | 1/1996 | Bhatt et al. |
| 5,537,108 A | * | 7/1996 | Nathan et al. ......... 340/825.84 |
| 5,542,602 A | | 8/1996 | Gaynes et al. |
| 5,557,844 A | | 9/1996 | Bhatt et al. |
| 5,620,782 A | | 4/1997 | Davis et al. |
| 5,640,308 A | * | 6/1997 | Osann, Jr. et al. .......... 361/777 |
| 5,699,613 A | | 12/1997 | Chong et al. |
| 5,713,508 A | | 2/1998 | Gaynes et al. |
| 5,736,681 A | * | 4/1998 | Yamamoto et al. ......... 174/265 |
| 5,758,413 A | | 6/1998 | Chong et al. |
| 5,962,815 A | * | 10/1999 | Lan et al. .................... 174/262 |

* cited by examiner

Primary Examiner—David L. Talbott
Assistant Examiner—José H. Alcalá
(74) Attorney, Agent, or Firm—Salzman & Levy; Lawrence R. Fraley

(57) ABSTRACT

The present invention provides a unique, high density, electronic package having a conductive composition for filling vias or through holes to make reliable vertical or Z-connects from a dielectric layer to adjacent electrical circuits. The through holes may be plated or non-plated prior to filling. A description for making high density electronic packaging using this feature is also disclosed.

3 Claims, 2 Drawing Sheets

ELECTRONIC PACKAGE HAVING SUBSTRATE WITH ELECTRICALLY CONDUCTIVE THROUGH HOLES FILLED WITH POLYMER AND CONDUCTIVE COMPOSITION

FIELD OF THE INVENTION

The present invention relates to printed circuit board and card manufacture and, more particularly, to a unique conductive composition for filling vias or through holes to make reliable vertical or Z-connects.

BACKGROUND OF THE INVENTION

With the continued trend toward reduced size of electronic components and the resulting high density requirements for electronic packaging, there has been an increased demand to design a process that will efficiently generate high quality, high density electronic packaging such as printed wiring board structures.

In the past decade the density per unit area of electronic devices, such as very large scale integrated circuits (VLSIs), has greatly increased. By some estimates this increase in density has been on the order of 10,000 times what it was in the earliest days of the technology. The space or area available outside of a VLSI in which to make the large number of necessary connections to and from it and to provide the necessary circuitry is becoming almost vanishingly small, measured by previous standards. Contrary to the density increase of VLSIs, the density of the passive circuits on printed wiring boards has increased (i.e., the parts have decreased in size) by only a relatively small factor: less than about 4 to 1. This presents the difficult problem of providing circuitry on the printed wiring board to the VLSIs which is small enough to fit the spaces available, while being sufficiently reliable and manufacturable to be economically useful.

Perhaps one of the most significant limitations for creating high density fine line circuitry on printed wiring boards is the generally known problem of anisotropic etching. It is known that etching metals, especially copper metal, is not an anisotropic process. That is, vertical etching is not feasible without some amount of unwanted horizontal etching. This creates a situation in which the features and circuitry so formed can be severely undercut, leading to different types of failures and reject material. The problem is exacerbated by having thick metal layers and thick photoresist layers. However, this is precisely the situation that occurs when plated through holes are part of conventional manufacturing process.

It is also well known that due to the nature of the plating process, the metal plating within a through hole or via is thinner than the plating on the external surfaces of the dielectric substrate; yet a minimum thickness in the through hole is required in order to provide an adequate and reliable electrical connection between circuitry on opposing surfaces or at various vertical levels within the printed wiring board structure. Therefore, the general practice is to plate excess material on the lateral faces in order to ensure sufficient plating of the through holes. The excessive thickness of the lateral surface plating causes greater amounts of undercutting during the later circuitization/etching process. To compensate for this effect, the circuitry lines are designed wider and farther apart than otherwise would be required or desired. In an attempt to resolve this problem, thinning down the lateral surface by uniform etching prior to circuitization has been attempted. If chemically performed, this process can also undesirably etch within the plated through hole. Mechanical etching of the lateral surface plating is possible, but requires an unacceptably long period of time.

Another difficulty in obtaining sufficient plating thickness within the through hole, as compared to plating the lateral surfaces, is the significant increase in expense associated with plating high aspect vias.

A land or pad around the through hole is required to provide a reliable electrical connection in the eventuality that there is a break in the plating on the rim of the through hole. The trade-off for applying a reliable land or pad is a thicker than necessary metallized region. Consequently, a thicker than usual photoresist layer must be applied to obtain a level surface for placement of the mask and to ensure the photoresist spanning over the hole (tenting) does not rupture and result in etchant entering the plated through hole. Thus, through holes cause an undesirable increase in thickness both of the surface plating and of the photoresist layer.

In addition to the problem of layer thickness discussed supra, the prior art process of plating through holes requires the land or pad on the lateral surface of the commoning layer to connect in a dog-bone configuration to the plated through holes. The land utilizes valuable space on the lateral surface that could otherwise be used for circuitry. Consequently, there has been a long standing desire to eliminate the need for such lands or pads.

The plated through hole itself also consumes valuable space for several reasons. Firstly, the diameter of the hole is typically dictated by the cost of plating high aspect vias and the cost of small diameter drilling bits. To avoid the expense of high aspect plated through holes, larger plated through holes are typically utilized, but they must be placed at a distance from the areas containing fine line circuitry. This design, known as "fan-out", however, contributes to loss of circuitry space due to the need for greater routing space.

Another known problem associated with conventional plated through holes is the different expansion rate between copper plating and the dielectric or pre-preg layer. When subjected to heating and cooling cycles, the plating on the through hole is susceptible to cracking.

PRIOR ART REFERENCES

Prior art literature addresses the problems associated with plated through holes and describes processes and materials of making alternative designs. Relevant prior art patents are summarized hereinbelow.

Hayakawa et al. in U.S. Pat. No. 4,383,363, teach the benefit of using conductive materials for filling through holes. The patent is directed toward the process of filling through holes and describes only a limited selection of conductive fillers.

Lambert et al. in U.S. Pat. No. 4,820,340, disclose a method of fabricating a conductive polymer interconnect (CPI) which employs chains of electrically conductive particles within an elastomeric matrix. The process requires removing a thin layer of elastomeric material from the outer surfaces by use of plasma etching in order to provide a conductive surface. Gold- or silver-plated nickel particles are used, but no mention is made of using copper as the conductive material. Particles are approximately 100 micron and are imbedded in an elastomer of polysiloxane room temperature vulcanizing (RTV) rubber. Magnetic fields are used to align the particles and then a heat cure step is performed. Subsequently, the surface layer of the cured rubber is removed by plasma etching. As reported in Lambert, et al., U.S. Pat. No. 4,820,376, plasma etching removes the gold shell leaving the nickel core exposed to air. To prevent aerial oxidation of the nickel, the material is plated with electroless gold.

Kawakami et al. disclose, in U.S. Pat. No. 5,220,135, a conductive filling within the through hole of an insulative substrate. Conductive resins are described which include silver, copper, and carbon conductive materials. No mention is made of a core-shell particle having a fusible shell.

Higgins, III et al. in U.S. Pat. Nos. 4,967,314 and 5,117,069, describe a method and material for eliminating plating in through holes by filling the through holes with a silver epoxy conductive paste. Higgins, III et al. employ a process wherein the vias are slightly overfilled with the conductive epoxy in order to create bumps at each end of the via. Then several printed wiring boards and prepreg layers are stacked up and subsequently laminated. During the lamination process, the excess epoxy is squeezed from the ends and spreads out over the printed wiring board layer to create intimate contact between the circuitry and the conductive polymer within the through hole. Higgins, III et al. teach away from the use of a copper epoxy by indicating that the copper epoxy would have a higher resistance than the silver epoxy. Furthermore, Higgins, III et al. prefer the use of thermoplastic paste compositions. Lastly, the epoxy composition is limited to high viscosity materials of approximately 100 centipoise in order to provide adequate adhesion of the epoxy within the via.

Bhatt et al. in U.S. Pat. Nos. 5,557,844 and 5,487,218, disclose a process and a material for forming filled through holes and blind holes. The filler material is an organic polymeric material, optionally with a particulate filler. The filler composition is compounded to have a coefficient of thermal expansion matching the coefficient of thermal expansion of the dielectric substrate. The fill material may be either conductive or non-conductive. These patents teach laminating a copper foil to a dielectric substrate, followed by thinning the foil to an acceptable thickness, then drilling through holes and subsequently electrolessly plating into the through holes to create a conductive layer therein. The filling in the '844 patent occurs after the etching process of the lateral metallized layers. Conductive filling compositions include resins made from epoxy- or cyanate-containing materials and have conductive material derived from carbon, copper, silver, nickel, molybdenum, gold, platinum, and aluminum. Particle size for the conductive materials ranges from 0.1 to 75 micron, the most preferred size being between 0.5 and 10 micron.

Chong et al., in U.S. Pat. Nos. 5,699,613 and 5,758,413, describe a method of manufacturing a multiple layer circuit board with stacked vias. These patents disclose a filled through hole having a conductive plug comprising a 70–80% copper fill.

Boyko et al., in U.S. Pat. No. 5,450,290, describe an integrated chip carrier and a technique for manufacturing same. The through hole is formed after copper sheets have been applied to the dielectric substrate and are initially plated by conventional electroless or electroplating techniques. Then a conductive paste is applied to the through holes. The paste is a epoxy novalak containing copper powder.

Gaynes et al., in U.S. Pat. No. 5,542,602, describe a conductive adhesive comprising a core-shell material having an inner core of copper, silver or gold and an outer shell of indium, tin or lead. Particles are approximately 10–15 micron in size and have a shell thickness of 1.0–1.5 micron. The patent is directed toward a solder replacement that can be used to affix two layers at temperatures below 220° C. and exploits a transient liquid phase (TLP) reaction for alloying on metals. A second application of the '602 patent replaces conventional conductive adhesives which require high concentrations of conductive particles in intimate contact to achieve a connector structure that is itself conductive. A polymeric material is used as a matrix or binder for the conductive particles. Upon curing, the binder creates compressive forces that ensure intimate contact of the conductive particles. The underlying concept of both applications in the '602 patent is that the shell metal, having a lower melting point than the core, will melt and alloy with the core upon reaching a critical temperature, creating a second phase that is between, but still electrically connected to, the core particles. In this manner, a low melting eutectic is formed which will create an isotropic stable conductive connection that can survive repeated thermal cycles. The patent is directed toward forming a metallurgical bond between two metal surfaces. No mention is made of using this material or similar materials as a filler within a through hole, nor is any mention made of the benefit that would be derived from such a process (i.e., the elimination of various processing steps such as electroless copper plating). Further, for the process to perform optimally, the curing temperature must be below the TLP temperature.

Other references to transient liquid phase bonding include: Wilcox et al., in U.S. Pat. No. 5,038,996; Davis et al., in U.S. Pat. No. 5,280,414; Galasco et al., in U.S. Pat. No. 5,432,998; Davis et al., in U.S. Pat. No. 5,620,782; and Gaynes et al., in U.S. Pat. No. 5,713,508.

Having discussed the general problem associated with the current practice of plating through holes to create Z-connects and the current attempts at solving the problem, it is understood that additional improvements would still be beneficial.

In summary, having the flexibility to eliminate or replace the thick lands surrounding the plated vias and to eliminate the plating of the vias would constitute a significant advancement in electronic package manufacturing and would alleviate the constraints imposed by the through hole plating process.

Therefore it is an object of the current invention to provide a high density (low pitch) fine line circuitry printed wiring board structure without the need for plating through holes.

It is another object of the invention to provide a high density (low pitch) fine line circuitry printed wiring board having multiple layers of circuitry interconnected with filled conductive through holes or blind holes.

It is another object of the invention to provide filled through holes to eliminate or reduce the need for thick lands, thereby providing higher density circuitry.

It is another object of the invention to utilize a thin, non-tenting resist in order to obtain high density circuitry.

It is yet another object of the invention to provide a process of filling the vias by vacuum fixturing without the need to plug via holes separately.

It is still another object of the invention to design a conductive fill material that can wet copper as well as dielectric material and also that can be directly solderable.

It is yet another object of the invention to reduce the registration budget by providing landless vias, having eliminated the concern for hole breakout.

Yet another object of this invention is to provide a method of making a circuitized substrate capable of being used as a chip carrier assembly, the method being performed in a facile and relatively inexpensive manner in comparison to existing carrier manufacturing processes.

It is a more particular object of the invention to provide such a process which is readily adaptable to existing manufacturing equipment without extensive modification thereof.

SUMMARY OF THE INVENTION

The present invention is designed to address the deficiencies in the art as well as the specific objects disclosed hereinabove.

In order to meet the objectives listed supra, a process has been designed to provide vias filled with a unique and novel conductive material.

The primary feature of the invention is to provide a conductive material that can be used to fill through holes or vias to Z-connect two or more layers of circuitry or conductor runs. The vias may optionally be plated with a conductive material; however, in one preferred aspect of the invention this is not required.

In accordance with another aspect of this invention, there is defined a method of making a circuitized substrate, the method comprising the steps of providing an electrically insulative base member having first and second surfaces, formation of at least one via hole, filling said via with a conductive material, optional planarization of the filled via on at least one of the first and second surfaces, and applying a first electrically conductive layer onto the first and second surfaces of the base member. The method still further includes applying a photoimaging material onto the thinned first conductive layer, then exposing and developing selected portions of the photoimaging material to define a pattern within the photoimaging material on the thinned first conductive layer. The method even further includes circuitizing the first conductive layer and then removing the photoimaging material from the first conductive layer. The fill material contained in the plated vias is not removed and can optionally be used to act as a solder point for surface mounting various components.

If multilayer structures are desired, the material described supra can be laminated to dielectric substrates containing a pre-preg and/or copper foil surfaces. In this manner, electrically conductive filled vias can connect external circuitry to internal circuitry or conductor runs.

The inventive fill material comprises a core-shell particle in a polymeric media that, under a defined pressure and temperature regime, cures to generate a solid plug having minimal shrinkage, thereby essentially filling the via volume. For purposes of definition, the curing temperature is considered the temperature at which a glass, viscous liquid, or rubber state resinous composition is converted into a solid three dimensional structure. The temperature at which this occurs is not necessarily a precise point and is affected by such factors as catalyst amount, pressure, and radiation. Therefore, the curing process occurs over a range of temperatures, but is easily observable as a physical change in state. The shells of the core-shell particles are designed to fuse with each other to generate an electrically connected network within the cured medium. The fusing temperature is defined as the melting temperature of the pure metal in the shell or the eutectic melting point of an alloy with core metal, should that occur. Therefore, in a single process, the invention provides a means for generating a solid conductive plug which can be electrically connected to later formed circuitry on the surfaces of the base member and to optional internal circuitry.

The benefit of the present invention is the ability to produce higher density circuitry than is currently available from existing designs. This invention can produce circuitry having a cross-section width of 0.7–2.0 mil and spacing between the circuitry of 1–2 mil. No other photolithographic processes are known to the inventors that can generate these same dimensions.

Other benefits and further scope of applicability of the present invention will become apparent from the detailed description given hereinbelow. It should be understood, however, that the detailed description and specific examples, while indicating preferred embodiments of the invention, are given by way of illustration only and are not to be construed as limitations of the current invention, since various changes and modifications within the scope and spirit of the invention will become apparent to those skilled in the art from this detailed description.

Furthermore, as is known in the art, changes in the amount of most critical parameters affect the benefit of an invention by a matter of degree and not normally with a precise point of success or failure. This is especially true when multiple variables might be involved. In this case, the situation is further complicated by interactions between such variables. Therefore, where parameters are given a value or range of values, it should be understood that these well defined areas clearly are within the scope of the invention. Yet other values might still be within the scope of the invention if the desired beneficial effects of the invention are demonstrated. For this reason, words such as "approximately" or "about" are used to indicate that the values presented are not necessarily true limits to the invention. The true inventive scope can be readily determined by experimentation.

BRIEF DESCRIPTION OF THE DRAWINGS

The following drawings illustrate the invention, and are to be considered in conjunction with the subsequent detailed description, in which:

FIG. 1b depicts a sectional view of a first alternate embodiment of the via-filled substrate shown in FIG. 1a;

FIG. 2 illustrates a sectional view of a second alternate embodiment of the via-filled substrate shown in FIG. 1a; and FIG. 3 shows a sectional view of a third alternate embodiment of the substrate shown in FIG. 1a.

For purposes of clarity and brevity, like elements and components shall bear the same numbering throughout the figures.

DETAILED DESCRIPTION OF THE PREFERRED EMBODIMENT

Figure 1A:
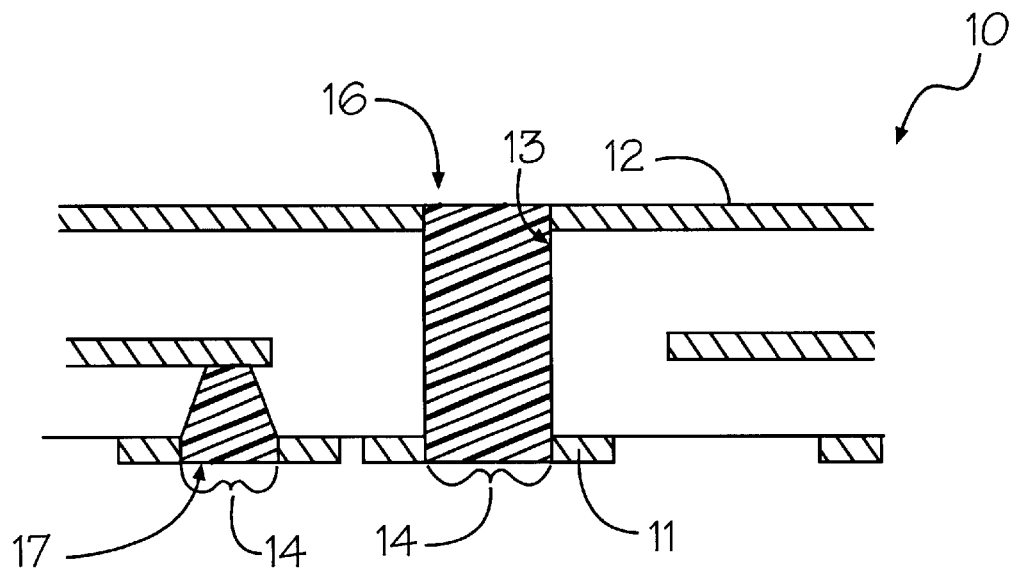
FIG. 1a illustrates a sectional view of the via-filled substrate of this invention.

The inventive core-shell material requires that the outer shell be composed of material that has a fusing temperature below the melting point of the internal core material. Several embodiments of this concept are contemplated within this invention. In one embodiment, the core comprises copper and the shell comprises tin (Sn), indium (In), bismuth (Bi), or antimony (Sb) and their alloys. In another embodiment, the core is an organic material and the shell is a metal, such as copper, tin or combinations thereof. In still another embodiment, the core is an inorganic material such as silica spheres, solid or hollow in nature and the shell is a metal such as tin or bismuth. When the core is composed of an organic material it might have a true melting point defined by a specific temperature at which the solid phase of the material is converted into a liquid phase. The melting process is a reversible process wherein the liquid phase can be converted into the solid phase by cooling. However, certain organic materials do not possess a melting point. Rather, they have a point at which the material irreversibly decomposes. Because this is not a reversible physical process, but rather a chemical reaction, the decomposition point is dependent on many factors, including rate of heating and presence of air.

Preferred organic materials used as a core particle in this invention include polyester and polystyrene.

The core-shell particles can be any shape, but typically they are essentially spherical. The particle size of the core material is 5–20 micron and the shell size is 0.2–1.0 micron. Therefore, the core-shell particle is preferably between about 5.4 and 22 micron. The core can be either solid or hollow depending on process of manufacture.

Preferred manufacturing processes for core-shell particles as found in the current invention include electroless coating, electrodeposition, physical or chemical vapor deposition, sputtering or the like.

The core-shell particle is then dispersed by mixing into a liquid media. The liquid media may be an organic resin which, upon heating, cures into a solid conductive article. Typically, an organic substance is used that is either thermosetting or thermoplastic. Examples of such a resin are epoxy, phenoxy, silicones, polyimides, polyimide-siloxane, siloxane, styrene allyl alcohol, polyester, and polystyrene.

The quantity of core-shell particle within the mixture is determined by the onset of electric conductivity within the cured article. The minimum electrical conductivity of the cured article in the present invention is $(0.01-0.1) \times 10^6$ $ohm^{-1}cm^{-1}$. This corresponds to a minimum concentration of 0.3 to 0.9 gm particles/gm mixture, which agrees with percolation theory models that have been generated to predict the concentration necessary to form a continuous, three dimensional network of conductive particles within a second matrix of non-conductive material. This model is used when interpenetrating networks (IPN) of the type described herein are formed. In addition to the conductive core-shell particle and the organic resin, other components are particularly useful within the current design as curing agents, such as anionic initiators, cationic initiators, carboxy functionalized initiators, polyamides, amido amines, polyamines, melamine-formaldehydes, phenol-formaldehydes, urea-formaldehydes, dicyandiamide, polyphenols, polysulfides, ketimines, novolacs, anhydrides, blocked isocyanates, imidazoles and carboxylic acids; and as catalysts or accelerators such as amines, phosphines, hydroxyl-containing compounds, imidazoles, organometallic compounds, Lewis acid compounds and sulfonium salts. The mixture of conductive particles, organic resin, curing agent and catalyst into a resinous composition creates a conductive paste or adhesive which, under the proper conditions, hardens to a solid plug.

Now referring to FIG. 1a, a sectional view of a substrate 10 used in this invention is shown.

The particles described hereinabove can be used to manufacture high density microelectronic packaging. For this application, the inventive process begins with an organic dielectric or insulative substrate 10 in the form of a film in order to provide a rigid or flexible printed wiring board structure. The thickness of the film can range from 0.5 mils to 8 mils, the preferred thickness range being from 0.5 mils to 8 mils, the preferred thickness range being between 1 mil and 3 mils. The substrate 10 must contain at least one through hole 16 or blind hole 17 and may additionally be multilayered, having embedded circuitry or conductor runs. The chemical composition of the dielectric substrate can be of various types including epoxies, polyimides, bismaleimides, cyanate esters, and combinations thereof, Teflon based dielectrics, aramid based dielectrics, woven or non-woven dielectric substrates, and particulate or non-particulate filled dielectrics. Preferred compositions include epoxies, polyimides, cyanate esters, and mixtures thereof, and Teflon based dielectrics. Such compositions are commercially available and are known in the art as organic circuit board laminates.

The through holes 16 can be formed by anyone of known penetrating techniques in the art, including drilling, punching, etching, or laser vaporization. Size of the through hole 16 is not critical to the invention, but it is preferred that the holes be as small as manufacturable by the various techniques. A typical diameter range for the through hole 16 utilized in the present invention is about 0.5 to about 18 mil, preferred diameter size being about 2 to about 12 mil.

Figure 1B:
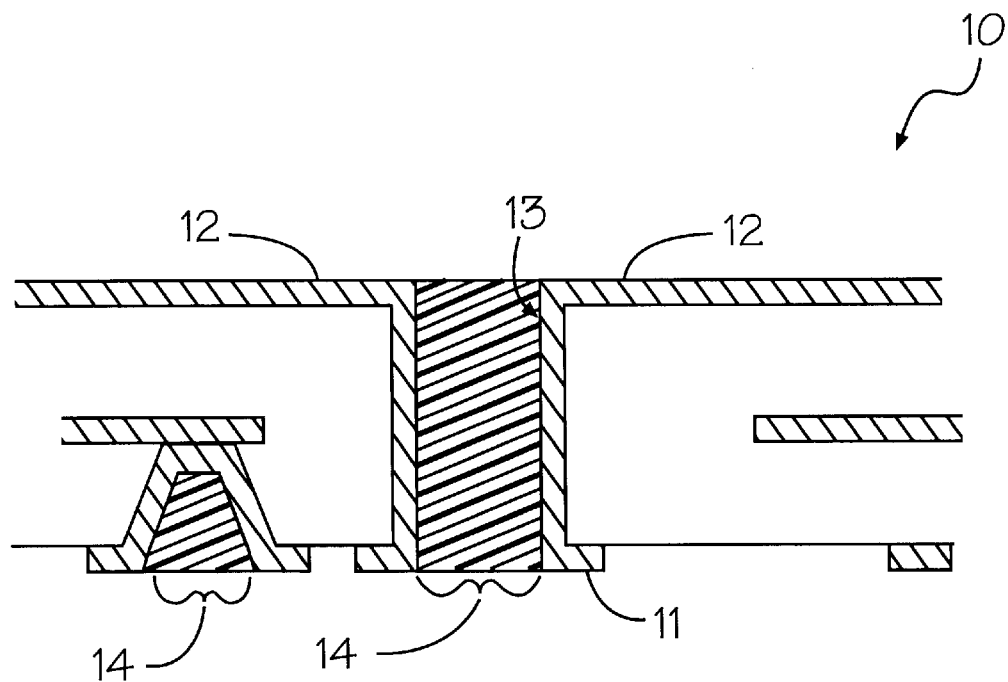

After formation of the through holes 16, the inner surface walls 13 should optionally be cleaned to remove debris and condition the surface for later coating applications. Although not required, one embodiment of the invention shown in FIG. 1b, allows for flash plating a layer 11 of less than 0.3 mil or electroless metal plating a layer 11 of about 0.5 mil on the through hole wall 13 and on major lateral surfaces 12 of the dielectric substrate 10, as shown in FIGS. 1a and 1b.

Prior to applying the optional metallic plate, the dielectric substrate may need to be pretreated to assure sufficient adhesion to the metal plate composition. Known processes such as conditioning with a cationic polymer and subsequent seeding with a noble metal such as palladium can be employed. Other methods that chemically or physically etch the dielectric substrate surface are also useful in this invention.

The through holes 16 are filled with the electrically conductive composition plug 14, described in detail hereinabove, by known processes in the art. Typically, due to the nature of the conductive material, filling can readily be achieved by using a mask and applying the filling material through the mask either under pressure or by vacuum. It is important that the filling process not entrap significant quantities of air, since after curing, the air pockets may cause physical weakening of the plug 14. To achieve a void-free plug 14, the conductive composition must be designed with appropriate viscosity and surface tension.

The filled through hole 16 and surrounding dielectric substrate is then subjected to a predetermined temperature to cure the polymeric binder within the conductive material plug 14. The heat treatment also fuses the outer shell of the core-shell particles together in order to create the continuous, three dimensional, electrically conductive network within the cured polymeric binder. Operating temperature for this process is typically in the range of 100° C. to about 200° C., a preferred temperature range being typically about 130° C. to about 180° C.

If performed in a single step (i.e., curing and fusing), then the operating temperature must be above both the curing and fusing temperature, but below the melt temperature of the core. In one embodiment, the curing temperature is above the fusing temperature. The curing and fusing temperatures are predetermined to be of sufficiently low value so that a wide operating temperature range exists without concern for thermal damage to physical or electrical properties of the dielectric substrate, circuitry or other components.

Furthermore, the melting point of the metal core of the core-shell particles is specifically determined to be above the operating temperature range for this invention.

The heating treatment is typically employed for about 15 to about 60 minutes, preferably about 15 to about 30 minutes. Optimal times depend on the operating temperature of the process.

The cured polymer binder and electrical conductive network possess certain unique, beneficial properties. A particularly beneficial property is for the material to be non-shrinking during curing. This is extremely important in order to create a tight seal between the cured polymeric binder structure (also known as a plug 14) and the vertical wall 13 of the dielectric substrate 10. Values of less than 28 ppm/° C. are considered useful for this formulation. Adhesion of the uncured and cured resin to the wall 13 is also a critical feature.

Another useful property of the cured plug 14 is that it is non-porous. This property allows the later use of a liquid photoresist or flashing or etching solutions without the need to protect the outer surface from liquid infiltration.

Figure 3:
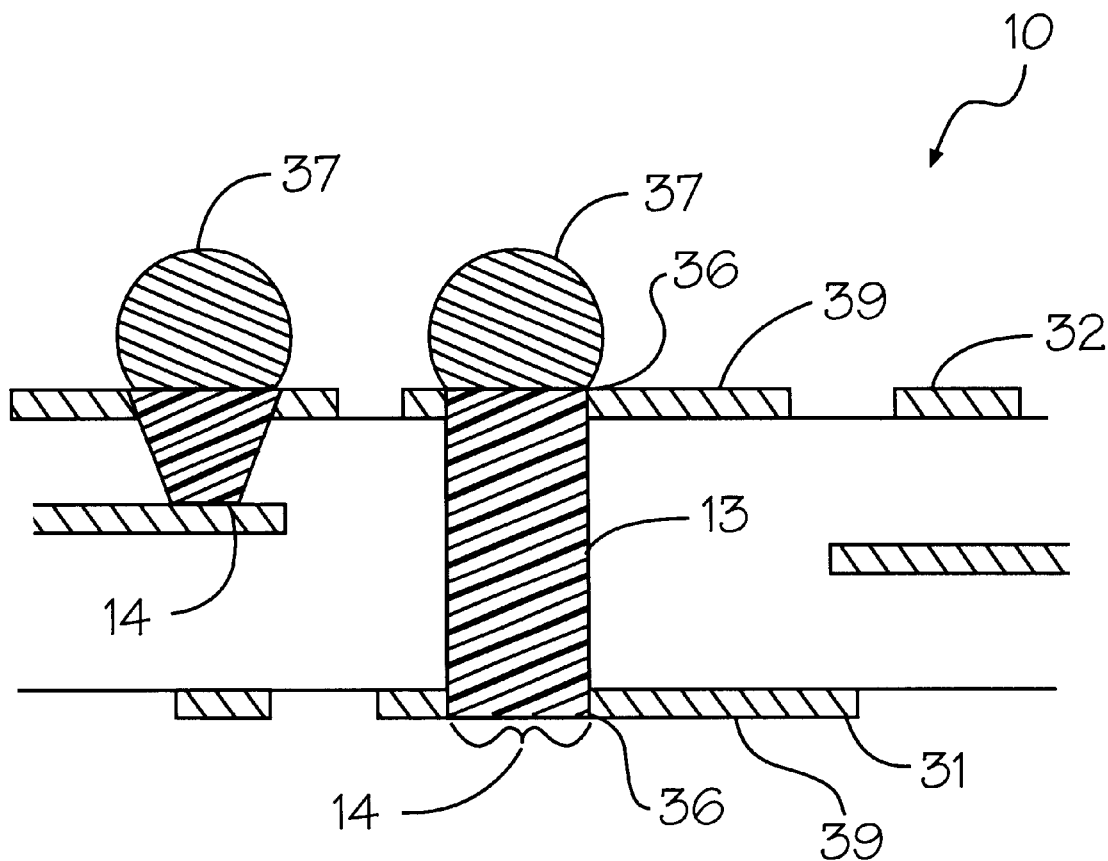

Another useful property of the cured plug 14 is that it should dry to a tack-free surface as shown in FIG. 3.

Still another useful property is the low thermal expansion of the cured material. The benefit of this feature is that no cracking is observed when the finished microelectronic package containing this cured plug 14 is subjected to repeated heating and cooling conditions.

It is also an important design feature of the invention to use the outer surface of the conductive plug 14 as a solder site 37 for various surface mount microelectronic components.

Although the filling operation is intended to provide a sufficient volume of binder and core-shell particles in order to just fill the through holes, commonly excess material is deposited and the ends 36 of the plug 14 extend beyond the lateral surface 39 of the dielectric substrate. Depending on final packaging design, the excessive outer end 36 of the cured plug 14 can be removed in an optional planarizing step. Planarization typically is performed by mechanical means well known in the art.

Figure 2:
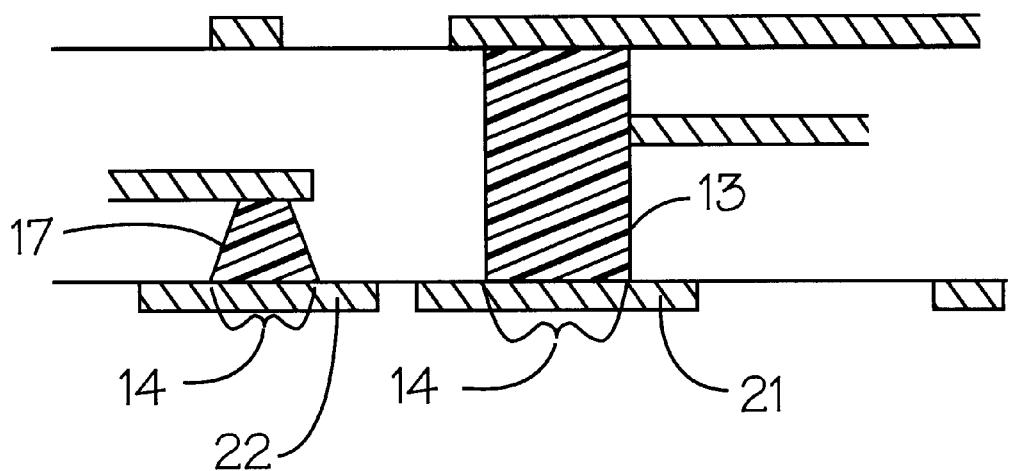

The dielectric substrate 10 is then coated with a metal 31, 32, and as metal layers 21, 22, illustrated in the embodiment shown in FIG. 2, that ultimately provides the circuitry and features of the manufactured printing board. The coating of the dielectric substrate can be accomplished by any of the known methods of plating, such as sputtering, electroless plating or electrolytic plating. Plating thickness can range from 5 microns to about 50 microns, the preferred thickness being in the range of 8 microns to 25 microns.

The chemical composition of the plating material typically is a conductive metal, examples including copper and its alloys, aluminum and its alloys, and nickel and its alloys. The uniform metallic plating thus applied is then converted into the necessary features and fine line circuitry found on the finished printed wiring board. Conversion, known in the industry as "personalization", typically is performed by photolithographic means that employ a series of steps including:

a) applying a photoresist to the metallic layer;

b) applying an opaque mask over the photoresist, the mask having discrete openings in the form of an image that are ultimately transferred to the metallic layer;

c) exposing the mask to electromagnetic radiation or an electron beam so that such radiation impinges only on the photoresist in areas of openings in the mask;

d) removing the mask;

e) applying a chemical etchant to the photoresist to create a series of openings extending to the underlying metallic layer in areas where the photoresist has high solubility;

f) chemically etching the areas of uncovered metal to uncover dielectric substrate, forming electrically discrete features and circuitry; and g) stripping the remaining portion of the photoresist from the upper surface of the latent features and circuitry.

The general description for this process is applicable to either a negative or positive working photoresist system. In the case of a negative working photoresist, the areas of photoresist etched are those that are unexposed to light; while for positive working photoresists, the areas exposed to light are more susceptible to etching. In either case, the present invention can generate the necessary features and fine line circuitry. Most preferred is the use of negative working photoresists either in dry film or liquid form. Examples of such materials include acrylate based dry film resist such as: MI supplied by McDermid, 4830, 4820 or PM 115 supplied by DuPont; and liquid negative resists such as polyisoprene or acrylate-based SM32 supplied by Shipley.

The thickness of the photoresist can be kept to a minimum, since tenting can be avoided in the current invention. The benefit of using such thin photoresist layer is the ability to achieve high circuit densities. Typical photoresist thickness in this invention is 0.2 mil to about 2.0 mil, a preferred thickness range being from about 0.5 mil to about 1.0 mil.

Depending on the thickness of the initial metallic layer, the discrete features and circuitry can be formed by any of the known processes in the art including subtractive, additive or semiadditive.

The next step in the process is to protect the fine line circuitry from the later plating steps of the features. Protection is achieved by employing a mask and photoresist of the types previously described. In this case, the photoresist is etched in areas where the features are to be plated and cover the fine line circuitry. The features that are exposed are the intermediary stages of the connection sites for external components (i.e., land grid arrays).

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

We claim:

1. A microelectronic package, whose circuitry has a cross-section width of between 0.7 mil and 2.0 mil, said microelectronic package comprising:

a) a dielectric substrate having upper and lower lateral faces and at least one via being defined by a wall;

b) electronic circuitry and features affixed to at least one of said lateral surfaces, said circuitry having a cross-sectional width of between 0.7 mil and 2.0 mil; and c) a composition comprising an interpenetrating network substantially filling said via, said network comprising a first matrix of cured thermosetting or thermoplastic material and a second matrix comprising an electrically conductive composition electrically connecting said via to said electronic circuitry.

2. The microelectronic package recited in claim 1 wherein said second matrix comprises a core-shell particle heating above the fusing point thereof.

3. The microelectronic package as recited in claim 1 further comprising a substantially homogeneous conductive layer disposed between said interpenetrating network composition and said wall.

* * * * *